(12) United States Patent
Lin

(10) Patent No.: US 6,438,644 B1
(45) Date of Patent: Aug. 20, 2002

(54) METHOD TO PREVENT A FLASH MEMORY FROM BEING MISWRITTEN

(75) Inventor: Chi Cheng Lin, Taoyuan (TW)

(73) Assignee: Acer Peripherals, Inc., Taoyuan (TW)

( * ) Notice: Subject to any disclaimer, the term of this patent is extended or adjusted under 35 U.S.C. 154(b) by 0 days.

(21) Appl. No.: 09/427,112

(22) Filed: Oct. 26, 1999

(30) Foreign Application Priority Data

Nov. 27, 1998  (TW) .......................................... 87119768

(51) Int. Cl.⁷ .......................... G06F 13/00; G06F 11/28; G11C 16/22
(52) U.S. Cl. ........................... 711/103; 714/42; 714/51; 365/195; 365/185.09
(58) Field of Search .................................. 711/103, 154; 365/195, 185.04, 185.09, 185.22, 189.07; 714/42, 51

(56) References Cited

U.S. PATENT DOCUMENTS

| | | | | |
|---|---|---|---|---|
| 5,036,460 A | * | 7/1991 | Takahira et al. ............. 711/103 |
| 5,381,366 A | * | 1/1995 | Kawauchi et al. ........... 365/195 |
| 5,579,270 A | * | 11/1996 | Yamazaki .................... 365/201 |
| 5,708,605 A | * | 1/1998 | Sato ...................... 365/185.29 |
| 5,742,787 A | * | 4/1998 | Talreja ........................ 711/103 |
| 5,805,501 A | * | 9/1998 | Shiau et al. ............. 365/185.29 |
| 5,925,139 A | * | 7/1999 | Yamada et al. ................ 714/14 |
| 6,081,870 A | * | 6/2000 | Roohparvar ................ 711/103 |

\* cited by examiner

Primary Examiner—Glenn Gossage
(74) Attorney, Agent, or Firm—Ladas & Parry

(57) ABSTRACT

A method is provided to prevent flash memory in a computer system from being miswritten. According to this method, a control parameter records the normal paths of a process module. Then a judge module decides whether or not the flash memory is to be written. When the judge module decides the flash memory is to be written, a prepare module conducts preparations for the flash memory. Then a check module is provided to confirm the normal paths from the process module in response to the control parameter, and a write module is provided to write the flash memory when the check module confirms the normal paths from the process module. An error module may be provided to restart the process module or the computer system or provide a warning signal when the check module does not confirm the normal paths from the process module.

10 Claims, 2 Drawing Sheets

METHOD TO PREVENT A FLASH MEMORY FROM BEING MISWRITTEN

BACKGROUND OF THE INVENTION

1. Field of the Invention

The present invention relates to a method to prevent a flash memory in a computer system from being miswritten, the method including a check module to confirm that the writing of the flash memory is from normal paths of a process module.

2. Description of the Related Art

Because a flash memory can be provided in a computer system to modify its firmware by end users, it is very convenient for both manufacturers and Internet users to update the firmware. Additionally, it is also economical to rework the flash memory. Therefore, the flash memory has been widely used to replace the conventional erasable and programmable read only memory (EPROM), which has to be written in advance and can not be modified.

However, it is possible that the flash memory is miswritten under certain situations, such as transience of the power supply, an unstable power supply or unstable control signals. In these cases, part or all of the data stored in the flash memory can be destroyed, resulting in unintended coding.

In practice, a large percentage of flash memories, even made by different methods or made of different materials, can be miswritten under these situations.

The Central Processing Unit (CPU) often operates in response to the data stored in the flash memory for control of the operating system (OS) and computer security. Once a flash memory is miswritten, unexpected errors may occur. Further, the damage to the flash memory causing such unexpected errors is permanent and can not be recovered by restarting the computer system.

SUMMARY OF THE INVENTION

Thefore, it is an object of the present invention to provide a method for preventing a flash memory in a computer system from being miswritten which can ensure the security of the flash memory using firmware modifications only.

It is another object of the present invention to provide a method to prevent a flash memory in a computer system from being miswritten which can ensure the security of the flash memory without any circuit modifications, thus requiring no increase in hardware and little increase in time.

To realize the above and other objects, the present invention provides a method to prevent a flash memory in a computer system from being miswritten. A first embodiment of the present invention includes the steps of executing a process module provided with a control parameter recording its normal paths, the control parameter being incremented for each executed step, executing a judge module to determine whether or not the flash memory is to be written. When the judge module determines the flash memory is to be written after the process module, a prepare module is executed to prepare the flash memory for writing. Then a check module is executed to confirm that the writing of the flash memory is from the normal paths of the process module by comparing the control parameter with a confirmation value, and a write module is executed to provide the flash memory when the check module confirms that the writing of the flash memory is from the normal paths of the process module.

In the method of the present invention, an error module can also be provided to restart the process module when the check module does not confirm that the writing of the flash memory is from the normal paths of the process module, Alternatively, in the method of the present invention, the error module can restart the computer system or generate a warning signal.

Further, the present invention also provides a method used to prevent a flash memory in a computer system from being miswritten. In accordance with a second embodiment of the present invention, a first module and a second module are first executed with a first parameter and a second parameter recording their normal paths respectively. Then, a judge module is provided to decide whether or not the flash memory is to be written after the first module or the second modules. When the judge module decides the flash memory id to be written after the first module or the second module, a prepare module is first provided to conduct preparations for the flash memory, then a check module is provided to confirm the normal paths for the first module or the second module, and a write module is provided to write the flash memory when the check module confirms the normal paths from the first module or the second module.

BRIEF DESCRIPTION OF THE DRAWINGS

Further objects, features and advantages of the present invention will become apparent from the following detailed description of a preferred embodiment of the invention with reference to the accompanying drawings.

DETAILED DESCRIPTION OF THE PREFERRED EMBODIMENT

To prevent a flash memory in a computer system from being miswritten, the present invention adds a check module to confirm that the writing of the flash memory is from normal paths of a process module.

In practice, the flash memory is usually miswritten in the following situations:

(a) The CPU may not successfully reset due to the transience of the power supply, and may incorrectly jump to a module which is designed to rewrite the flash memory, thus miswriting the flash memory.

(b) During normal operations, the CPU may be unexpectedly interrupted due to external noise, such as voltage variations and electromagnetic interference, and may incorrectly jump from original routines to a module which is designed to rewrite the flash memory, thus miswriting the flash memory.

That is, the flash memory is mostly miswritten because of an irregular jump to a module which is designed to rewrite the flash memory. Therefore, if the CPU is prevented from rewriting the flash memory due to these irregular jumps, the miswriting of the flash memory can be accordingly resolved.

Figure 1:
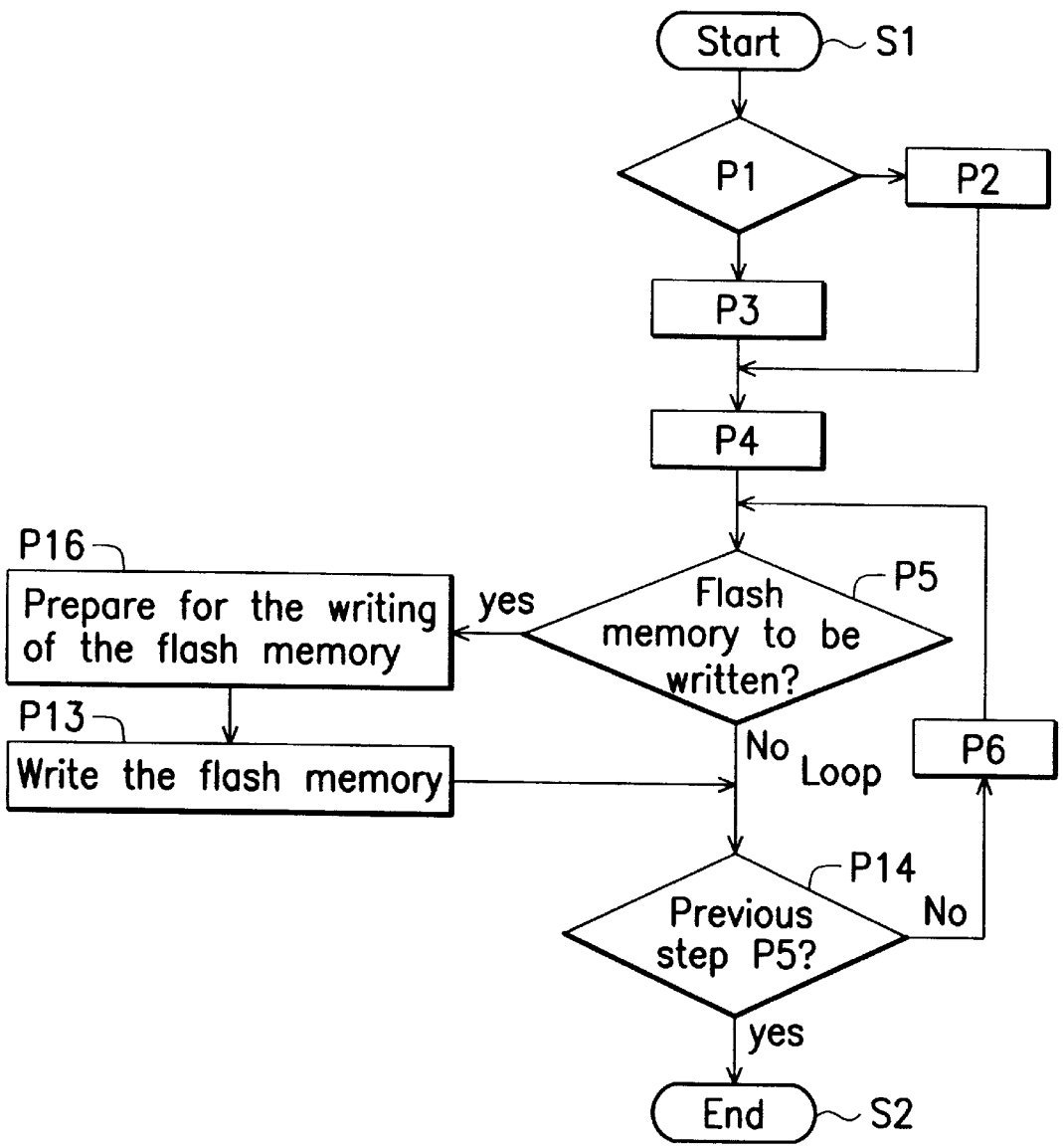
FIG. 1 (Prior Art) is a flow chart showing a conventional method to write a flash memory in a computer system.

FIG. 1 (Prior Art) is a flow chart showing a conventional method to write a flash memory in a computer system.

As shown in FIG. 1, a process module is started with a starting step Si, proceeded through steps P1→P3 (or P2)→P4→P5→P14→P6→P5→P14→ . . . , and ended with an ending step S2. In this process module, the judge step P5 is used to decide whether or not the flash memory is to be written. When the judge step P5 decides to perform the writing of the flash memory, the prepare step P16 and the write step P13 are performed to accomplish the writing of the flash memory.

However, it is also possible that the CPU may incorrectly jump from irregular routines to the prepare step P16 and the write step P13. For example, the CPU may directly jump to the prepare step 16 or the write step P13 from the step P1 or any other steps. Therefore, it is difficult to prevent the flash memory from being miswritten.

As a result, the present invention provides a control parameter to record normal paths of the process module. Thus, the write step P13 can be executed only when it is confirmed in response to the control parameter that the writing of the flash memory is from the normal paths of the process module.

Figure 2:
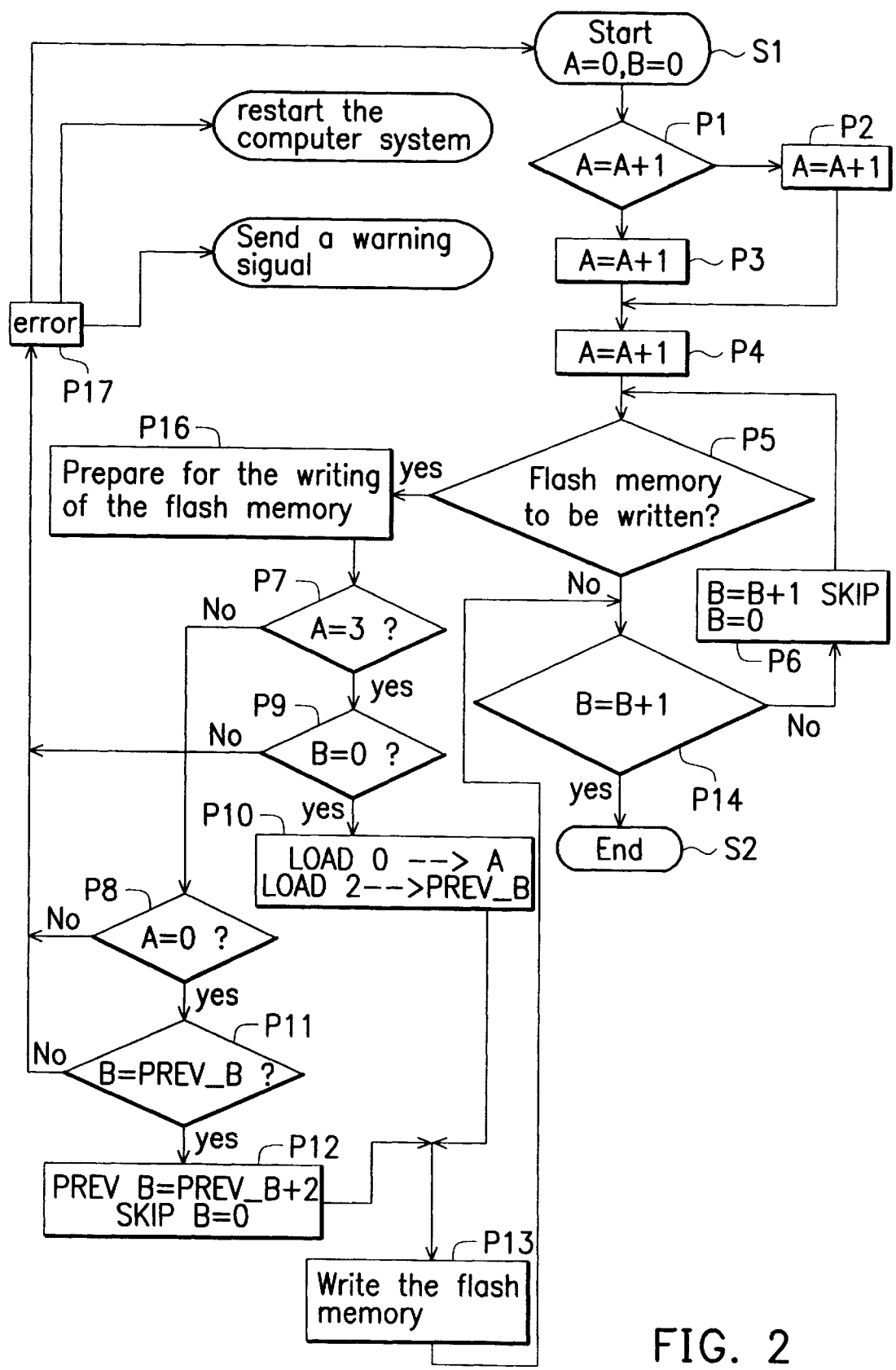
FIG. 2 is a flow chart showing a method to prevent a flash memory in a computer system from being miswritten according to the present invention.

FIG. 2 is a flow chart showing a method to prevent a flash memory in a computer system from being miswritten according to the present invention.

As shown in FIG. 2, a process module is started with a starting step S1. In the starting step S1, several control parameters are added to record normal paths of the process module and reset to default values. The number of the control parameters is determined by the number of paths needed to be detected. In this embodiment, the number of paths needed to be detected is two, steps P1→P3 (P2)→P4 and steps P14→P6, therefore two control parameters (A and B) are added and reset to default values (A=0; B=0).

Then, the steps P1→P3 (P2)→P4 are performed. In this embodiment, the control parameter A is used to record normal paths of the steps P1→P3 (P2)→P4. As an example, when any of the steps P1, P3(P2), P4 is performed, the control parameter A is automatically increased by one to indicate that the step is performed. Therefore, the control parameter A is expected to be three after the completion of the step P4 if the steps P1→P3 (P2)→P4 are normally performed.

Next, the judge step P5 is performed. The judge step P5 is provided to decide whether or not the flash memory is to be written. When the judge step P5 determines that the writing of the flash memory should proceed, step P16 is performed. Otherwise, the step P14 is performed. The step P14 checks whether or not the previous step is the judge step P5. If the previous step is the judge step P5, the process module is ended with the end step S2. Otherwise, the step P6 is performed which is followed with the judge step P5. In this embodiment, the control parameter B is used to record normal paths of the steps P5→P14→P6. As an example, when any of the steps P14, P6 is performed, the control parameter B is automatically increased by one to indicate that the step is performed. Therefore, the control parameter B is expected to be increased by two after the completion of the steps P14, P6 if the previous step of the step P14 is not the judge step P5.

Further, because the prepare step P16 is the biggest part of the overall process module, the CPU is also most likely to incorrectly jump to the prepare step P16 due to the transience of the power supply or external noise, as mentioned above. Therefore, the present invention further includes a check step (P7~P12) between the prepare step P16 and the write step P13. In this embodiment, the check step is used to confirm that the writing of the flash memory is from normal paths of the process module in response to the control parameters A and B. For example, control parameter A is used to confirm whether the write step P13 was reached via steps P1→P3 (P2)→P4→P5→P16→P13, while control parameter B is used to confirm whether write step P13 was reached via the steps P1→P3 (P2)→P4→P5→ the writing of the flash memory (the prepare step P16 through the write step P13)→P14→P6→P5→P16→P13.

After the prepare step P16, the check step first checks if A=3 (the step P7) and B=0 (the step P9). If A=3 and B=0, i.e., the writing of the flash memory is from the steps P1→P3 (P2)→P4, and the control parameter A is again reset to the default value (A=0) and another check parameter PREV_B is set to a default value (PREV_B=2) in the step P10. The default value of the check parameter PREV_B is the expected value of the control parameter B after performing the steps P14, P6. Then, the write step P13 is performed, and the steps P14 and P6 are repeated.

Next, the check step checks if A=0 (the step P8) and B=PREV_B (the step P11). If A=0 and B=PREV_B (the expected value of the control parameter B after the steps P14 and P6→ . . . ), the writing of the flash memory is from the steps P1→P3 (P2)→P4→P5→ the writing of the flash memory (the prepare step P16 through the write step P13) →P14→P6, and the check parameter PREV_B is automatically increased by two (an increment expected to add to the control parameter B after the steps P14 and P6) in the step P12. Then, the write step P13 is performed, and the steps P14 and P6 are again repeated.

Otherwise, the writing of the flash memory is from abnormal paths of the process module. In these cases, the check step further provides an error step P17 to stop the subsequent write step P13. Further, the error step P17 can also be used to restart the process module, restart the computer system or send a warning signal on a screen.

According to the present invention, even if the CPU incorrectly jumps to the prepare step P16, the miswriting of the flash memory can be prevented by the check step (including the steps P7, P9, P10 and the steps P8, P11, P12) which can halt the write step P13 in response to the control parameters A, B.

Therefore, the probability of the miswritten flash memory is greatly reduced. Further, because the check step takes only a little time to check the control parameters A, B, the overall performance of the process module will not be influenced.

Summing up the above, the method to prevent a flash memory in a computer system from being miswritten according to the present invention can ensure the security of the flash memory without any circuit modifications, thus requiring no increase in hardware and little increase in time.

It should be understood that the present invention is not limited to the preferred embodiment as disclosed above. Variations and modifications can be made by those who are skillful in the art without departing from the spirit and scope of the present invention as defined in the appended claims. Thus, this invention is not to be limited to the disclosed embodiment except as required by the appended claims.

What is claimed is:

1. A method to prevent a flash memory in a computer system from being miswritten, comprising the steps of:

executing a process module provided with a control parameter recording its normal paths, the control parameter being a value that is incremented for each of a plurality of predetermined steps executed;

executing a judge module to determine whether or not the flash memory is to be written;

executing a prepare module to prepare the flash memory for writing when the judge module determines the flash memory is to be written;

executing a check module to confirm that the writing of the flash memory is from normal paths of the process module by comparing the value of the control parameter with a confirmation value; and executing a write module to write the flash memory when the check module confirms that the writing of the flash memory is from normal paths of the process module;

wherein the confirmation value corresponds to the number of the plurality of predetermined steps executed in the process module when the steps are performed normally.

2. The method as claimed in claim 1, further comprising the step of executing an error module to restart the process module when the check module does not confirm that the writing of the flash memory is from normal paths of the process module.

3. The method as claimed in claim 1, further comprising the step of executing an error module to restart the computer system when the check module does not confirm that the writing of the flash memory is from normal paths of the process module.

4. The method as claimed in claim 1, further comprising the step of executing an error module to send a warning signal when the check module does not confirm that the writing of the flash memory is from normal paths of the process module.

5. A method used to prevent a flash memory in a computer system from being miswritten, comprising the steps of:

executing a process module provided with a first control parameter recording the normal path of a first path, the first control parameter being a first value that is incremented for each of a plurality of predetermined first steps executed in the first path, and a second control parameter recording the normal path of a second path, the second control parameter being a second value that is incremented for each of a plurality of predetermined second steps executed in the second path;

executing a judge module to determine whether or not the flash memory is to be written;

executing a prepare module to prepare the flash memory for writing when the judge module determines the flash memory is to be written after the process module has been executed;

executing a check module to confirm that the writing of the flash memory is from the normal paths of the first path or the second path of the process module by comparing the value of the first control parameter with a first confirmation value and comparing the second control parameter with a second confirmation value; and executing a write module to write the flash memory when the check module confirms that the writing of the flash memory is from the normal paths of the first path or the second path;

wherein the first confirmation value corresponds to the number of the plurality of predetermined first steps executed in the first path when the steps are performed normally, and the second confirmation value corresponds to the number of the plurality of predetermined second steps executed in the second path when the steps are performed normally.

6. The method as claimed in claim 5, further comprising the step of executing an error module to restart the process module when the check module does not confirm that the writing of the flash memory is from the normal paths of the first path or the second path.

7. The method as claimed in claim 5, further comprising the step of executing an error module to restart the computer system when the check module does not confirm that the writing of the flash memory is from the normal paths of the first path or the second path.

8. The method as claimed in claim 5, further comprising the step of executing an error module to send a warning signal when the check module does not confirm that the writing of the flash memory is from the normal paths of the first path or the second path.

9. The method as claimed in claim 5, wherein the first control parameter is reset to zero after the check module is executed.

10. The method as claimed in claim 5, wherein the second confirmation value is incremented after the check module is executed.

* * * * *